(12) United States Patent
Kroenke et al.

(10) Patent No.: US 6,806,097 B2
(45) Date of Patent: Oct. 19, 2004

(54) METHOD FOR FABRICATING FERROELECTRIC MEMORY CELLS

(75) Inventors: Matthias Kroenke, Dresden (DE); Igor Kasko, Mennecy (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/669,072

(22) Filed: Sep. 23, 2003

(65) Prior Publication Data

US 2004/0157345 A1 Aug. 12, 2004

Related U.S. Application Data

(63) Continuation of application No. PCT/DE02/01054, filed on Mar. 22, 2002.

(30) Foreign Application Priority Data

Mar. 23, 2001 (DE) .......................................... 101 14 406

(51) Int. Cl.$^7$ .............................................. H01L 21/00
(52) U.S. Cl. ............................................ 438/3; 438/240
(58) Field of Search ..................... 438/3, 240, 250–256, 438/393–399; 257/295

(56) References Cited

U.S. PATENT DOCUMENTS

| | | | |
|---|---|---|---|
| 5,342,648 A | * 8/1994 | MacKenzie et al. | 427/126.3 |
| 5,434,102 A | * 7/1995 | Watanabe et al. | 438/3 |
| 5,536,672 A | 7/1996 | Miller et al. | |
| 5,932,907 A | 8/1999 | Grill et al. | |
| 6,534,375 B2 | * 3/2003 | Iijima et al. | 438/386 |
| 2002/0070404 A1 | 6/2002 | Bruchhaus et al. | |
| 2002/0185683 A1 | 12/2002 | Yamazaki et al. | |

FOREIGN PATENT DOCUMENTS

| | | |
|---|---|---|
| DE | 100 14 315 A1 | 10/2000 |
| WO | 98/15012 | 4/1998 |
| WO | 99/28972 | 6/1999 |
| WO | 00/39842 | 7/2000 |
| WO | 00/49660 | 8/2000 |

OTHER PUBLICATIONS

Heintze, M. et al.: "Oxygen Impurity Effects on the Formation of Thin Titanium Silicide Films by Rapid Thermal Annealing", J. Appl. Phys., vol. 23, 1990, pp. 1076–1081.
Wee, A. et al.: "Investigation of Titanium Silicide Formation Using Secondary Ion Mass Spectrometry", Mat. Res. Soc. Symp. Proc., vol. 342, Apr. 4, 1994, pp. 117–122.

* cited by examiner

Primary Examiner—John F. Niebling
Assistant Examiner—Jennifer M. Kennedy
(74) Attorney, Agent, or Firm—Laurence A. Greenberg; Werner H. Stemer; Gregory L. Mayback

(57) ABSTRACT

Ferroelectric memory cells are produced according to the stack principle. An adhesive layer is formed between a capacitor electrode of a memory capacitor and a conductive plug. An oxygen diffusion barrier is formed above the adhesive layer and once the ferroelectric has been deposited, the adhesive layer and the barrier are subjected to rapid thermal processing (RTP) in an oxygen atmosphere. An oxygen rate of the adhesive layer and the diffusion coefficient of oxygen in the material of the adhesive layer dependent on the temperature are determined. A diffusion coefficient of silicon in the material of the adhesive layer, dependent on the temperature, is determined. A temperature range for the RTP step from the two diffusion coefficients, determined for a predetermined layer thickness and layer width of the adhesive layer and the oxygen diffusion barrier is calculated, therefore, the siliconization of the adhesive layer occurs more rapidly than its oxidation.

3 Claims, 2 Drawing Sheets

METHOD FOR FABRICATING FERROELECTRIC MEMORY CELLS

CROSS-REFERENCE TO RELATED APPLICATION

This application is a continuation of copending International Application No. PCT/DE02/01054, filed Mar. 22, 2002, which designated the United States and was not published in English.

BACKGROUND OF THE INVENTION

FIELD OF THE INVENTION

The invention relates to a method for fabricating memory cells in accordance with the stacked principle, in which a bonding layer immediately above the plug is formed between a lower capacitor electrode of a ferroelectric storage capacitor and a conductive plug of polysilicon which is formed beneath the ferroelectric storage capacitor and is used to electrically connect the capacitor electrode to a transistor electrode of a selection transistor formed in or on a semiconductor wafer. An oxygen diffusion barrier is formed above the bonding layer, and after the ferroelectric has been deposited it is subjected to a rapid thermal processing step in an oxygen atmosphere after the formation of the ferroelectric and before a ferro anneal thereof.

In the case of ferroelectric memory cells constructed according to the stacked cell principle, it is typical for transistors to be fabricated in or on a semiconductor wafer. Then, an intermediate oxide is deposited. The ferroelectric capacitor modules are fabricated on the intermediate oxide. The ferroelectric capacitor modules are connected to the transistors by a plug, which in the case of the stacked cell principle is located directly beneath the capacitor module.

To condition the ferroelectric layer of the ferroelectric capacitor module, it is necessary to carry out a ferro anneal in an oxygen atmosphere at temperatures of up to 800° C. During the ferro anneal, the plug, which generally is formed of polysilicon or tungsten, has to be protected from oxidation, since otherwise the electrical connection between the lower capacitor electrode and the transistor is irreversibly broken. Moreover, reactions between the electrodes, the ferroelectric and the plug is to be avoided wherever they adversely affect the functionality of the chip.

All products that are currently commercially available with ferroelectric layers are constructed according to the offset cell principle and have an integration density of only a few kilobits up to one megabit.

To protect the plug from oxidation in a ferroelectric memory constructed according to the stacked cell principle, layer systems that contain an oxygen diffusion barrier and a bonding layer below have been introduced. However, it is very difficult to prevent the oxidation of the oxygen diffusion barrier and in particular of the bonding layer below and of the plug of polysilicon or tungsten or its surface from the side during the ferro anneal.

Experiments carried out by the inventors on prototypes have shown that competing processes were taking place in the bonding layer consisting of titanium during the ferro anneal.

FIG. 1 shows a diagrammatic cross section through part of a ferroelectric memory cell constructed in accordance with the stacked cell principle. FIG. 1 shows a plug 1, which leads through an intermediate oxide layer 7 (TEOS) and is made, for example, from polysilicon, a lower part 2 of a bonding layer, for example made from $TiSi_2$, located immediately above it, an upper part 3 of the bonding layer, for example made from Ti, located above the lower part of the bonding layer, a lower part 4 of an oxygen diffusion barrier, for example made from Ir, and above this a second part 5 of the oxygen diffusion barrier, for example made from $IrO_2$. Above the upper $IrO_2$ section 5 of the oxygen diffusion barrier is the lower capacitor electrode 6, for example consisting of Pt. The oxidation which takes place from the side during the ferro anneal is indicated by bold arrows filled in black in FIG. 1, and the simultaneous formation of TiSi—Ir in the bonding layer 2, 3 is denoted by unfilled arrows in FIG. 1. A circle denoted by II surrounds an excerpt, details of which are illustrated in FIGS. 2A and 2B, to which the description below relates. The processes and formations diagrammatically depicted in FIGS. 2A and 2B result from transmission electron microscope (TEM) images produced by the inventors. FIG. 2A once again uses a bold arrow to show the oxidation of the bonding layer 2, 3 which takes place from the side. In this case, an insulating TiSi—O region 10 forms from the side. The arrows that are not colored in in black illustrate the siliciding, namely the formation of TiSi—Ir, which takes place from above and below. In FIG. 2A, the conductive TiSi—Ir layer has taken place more quickly than the formation of the insulating TiSi—O layer 10 from the side.

By contrast, in FIG. 2B the insulating TiSi—O region 10 from the side has formed over the entire width of the plug 1, and the latter is no longer electrically connected to the lower electrode 6 of the ferroelectric capacitor.

It is therefore found that, despite the Ir/IrOx coverage of the Ti bonding layer, there is an oxygen diffusion path along the IrOx/TEOS interface, which can partly oxidize the bonding layer 2.

During the experiments carried out by the inventors, it has emerged that the rate at which the formation of TiSi—O proceeds from the side and at which the simultaneous formation of TiSi—Ir from above and below takes place are dependent on the temperature at which these reactions occur.

With the aid of a rapid thermal processing (RTP) step in oxygen, it is possible to accelerate the formation of TiSi—Ir from above and below in the bonding layer compared to the formation of TiSi—O from the side.

A reference by M. Heintze, A. Catana, P. E. Schmid, F. Lévy, P. Stadelmann and P. Weiss, titled "Oxygen Impurity Effects On The Formation Of Thin Titanium Silicide Films By Rapid Thermal Annealing", J. Phys. D: Appl. Phys., Bd. 23, 1990, pages 1076–1081, XP001124373, deals with the behavior of oxygen impurities in the diffusion between titanium and silicon during an RTP step in a temperature range from 480° C. to 800° C. By way of example, FIG. 1 of the document shows concentration profiles of sintered Ti/Si diffusion pairs in the case of an RTP step at 500° C. for 20 seconds, 60 seconds and 120 seconds. Furthermore, FIG. 2 of that document shows concentration profiles of titanium silicide specimens that have been treated by an RTP step for 60 seconds at 550° C., 600° C. and 800° C. On the basis of their tests, the editors come to the conclusion that the oxygen prevents the complete reaction of the siliciding of titanium at temperatures below 650° C. By contrast, above this temperature it is observed that titanium is completely consumed by the Ti/Si reaction and that the silicide that results is substantially free of oxygen contamination (FIG. 2C). The discoveries obtained in this document through tests therefore concur with the findings described by the present inventors in the introductory part of the description of the present patent application on the basis of FIGS. 1, 2A and 2B that the rate at which the formation of TiSi—O and the simultaneous formation of TiSi—Ir take place is dependent on the temperature at which these reactions take place, and that with the aid of an RTP step at high temperature it is possible to accelerate the formation of TiSi—Ir compared to the formation of oxide. However, the editors of the above-mentioned document do not give any indication whatsoever of calculating an optimum temperature range, and apart from the detail that the thickness of the Ti/Si specimen is 40 nm, their explanations do not give any statements concerning the influencing of the siliciding reaction as a function of the dimensions of a component.

Virtually identical results are obtained in the reference by Wee A T S, Huan A C H, Thian W H, Tan K L, Hogan R, titled "Investigation of Titanium Silicide formation using secondary Ion mass spectrometry", Mat. Res. Soc. Symp. Proc., Vol. 342, 1994. The rapid high-temperature treatment referred to in that document as RTA (rapid thermal annealing) takes place for twenty seconds in a nitrogen atmosphere at approximately 650° C. Therefore, the rapid high-temperature treatment of that document differs from the RTP treatment in the present patent application, which takes place in an oxygen atmosphere. FIG. 1B of that document shows that the titanium siliciding dominates the oxidation of titanium during an annealing step at 620° C. (100 minutes). The curves shown in FIG. 2 of this document deal with the results which are achieved by the abovementioned RTA step in a nitrogen atmosphere, and in particular FIG. 2A, in accordance with the editors' information, proves that the RTA step in a nitrogen atmosphere allows the siliciding of titanium to take place substantially uninfluenced by oxygen diffusion. This document too fails to describe any calculation algorithm with which it is possible to calculate the optimum temperature range for an RTP step in an oxygen atmosphere.

International Publication WO 00/39842 A discloses a ferroelectric memory cell constructed in accordance with the stacked principle as mentioned in the introductory part of the description. The third paragraph of page 15 of document D1 describes a high-temperature annealing step (for example a ferro anneal) in an oxygen-containing atmosphere in order to crystallize out the dielectric metal oxide-containing layer, i.e. the ferroelectric, this ferro anneal, in the case where SBT is used for the ferroelectric, being carried out for one hour at 800° C.

Document D1 does not at any point mention an RTP step in an oxygen atmosphere being carried out prior to the ferro anneal.

U.S. Pat. No. 5,932,907 has likewise recognized the problem of oxidation of a precious metal layer which occurs during the ferro anneal competing with the siliciding of this layer, and proposes an oxygen diffusion barrier between unreacted precious metal and a precious metal silicide layer. This document does not give any indication of an RTP step in an oxygen atmosphere being carried out prior to a ferro anneal.

SUMMARY OF THE INVENTION

It is accordingly an object of the invention to provide a method for fabricating ferroelectric memory cells that overcomes the above-mentioned disadvantages of the prior art methods of this general type, which are constructed in accordance with the stacked principle in such a way that for a predetermined thickness of the Ti bonding layer it is possible to find an associated ideal RTP temperature at which the layer system remains conductive. With the foregoing and other objects in view there is provided, in accordance with the invention, a method for fabricating ferroelectric memory cells in accordance with the stacked principle. The method includes providing a conductive plug formed of polysilicon, and forming a bonding layer directly above the conductive plug and between a lower capacitor electrode of a ferroelectric storage capacitor and the conductive plug. The conductive plug is formed beneath the ferroelectric storage capacitor and electrically connects the lower capacitor electrode to a transistor electrode of a selection transistor formed in or on a semiconductor wafer. An oxygen diffusion barrier is formed above the bonding layer. A rapid thermal process (RTP) step in an oxygen atmosphere is performed, after a ferroelectric deposition and before a ferro anneal has been formed. The RTP step includes:

determining an oxygen rate of the bonding layer and a first diffusion coefficient ($D_{oxygen}$) of oxygen in a material of the bonding layer in dependence on temperature;

determining a second diffusion coefficient ($D_{silicon}$) of silicon in the material of the bonding layer in dependence on the temperature; and calculating an optimum temperature range for the RTP step from the first and second diffusion coefficients ($D_{oxygen}$ and $D_{silicon}$) for a predetermined layer thickness and a layer width of a layer system formed of the bonding layer and the oxygen diffusion barrier from the relationship $$\frac{(d_{BARR})^2}{D_{silicon}} \left\langle \frac{(b_{BARR})^2}{D_{oxygen}} \right.$$

in which the left-hand term denotes a period of time required for full siliciding of the bonding layer, and the right-hand term denotes a period of time required to fully oxidize the bonding layer, $d_{BARR}$ denotes the predetermined layer thickness of the layer system formed of the bonding layer and the oxygen diffusion barrier, $b_{BARR}$ denotes half the layer width of the layer system containing the bonding layer and the oxygen diffusion barrier, so that during the RTP step siliciding of the bonding layer takes place more quickly than its oxidation.

In the invention, the oxidation rate of the bonding layer is determined, and from this the diffusion coefficient of oxygen in the material of the bonding layer, for example titanium, is determined as a function of the temperature. The rate at which a TiSi—Ir layer is formed from a titanium layer is formed, and from this the diffusion coefficient as a function of the temperature is also determined. Then, given a predetermined titanium layer thickness, it is possible to use the temperature-dependent diffusion coefficient and the oxidation rate to calculate the optimum temperature which is required to enable the TiSi—Ir formation to take place quickly enough, i.e. more quickly than the simultaneous formation of the insulating TiSi—O regions, in order to maintain the conductivity of the layer system.

The invention gives a formula that can be used to calculate the optimum temperature range or the optimum temperature for the RTP step:

$$\frac{(d_{BARR})^2}{D_{silicon}} \left/ \frac{(b_{BARR})^2}{D_{oxygen}} \right., \tag{1}$$

In relationship (1), the left-hand term denotes the period of time required for full siliciding of the bonding layer, and the right-hand term denotes the period of time required to fully oxidize the bonding layer;

$d_{BARR}$ denotes the layer thickness of the system containing the oxygen diffusion barrier and the bonding layer thereof;

$b_{BARR}$ denotes half the layer width;

$D_{silicon}$ denotes the temperature-dependent diffusion coefficient of silicon; and $D_{oxygen}$ denotes the temperature-dependent diffusion coefficient of oxygen in the material of the bonding layer.

In accordance with an added mode of the invention, there is the step of forming the bonding layer, due to the RTP step, to contain a lower layer made from $TiSi_2$ and an upper layer made from Ti and disposed directly above the lower layer.

In accordance with a further mode of the invention, there is the step of forming the oxygen diffusion barrier, prior to the RTP step, to contain a diffusion lower layer made of Ir, which lies directly above the upper layer of the bonding layer, and a diffusion upper layer of $IrO_2$ directly covering the diffusion lower layer of the oxygen diffusion barrier.

Other features which are considered as characteristic for the invention are set forth in the appended claims.

Although the invention is illustrated and described herein as embodied in a method for fabricating ferroelectric memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
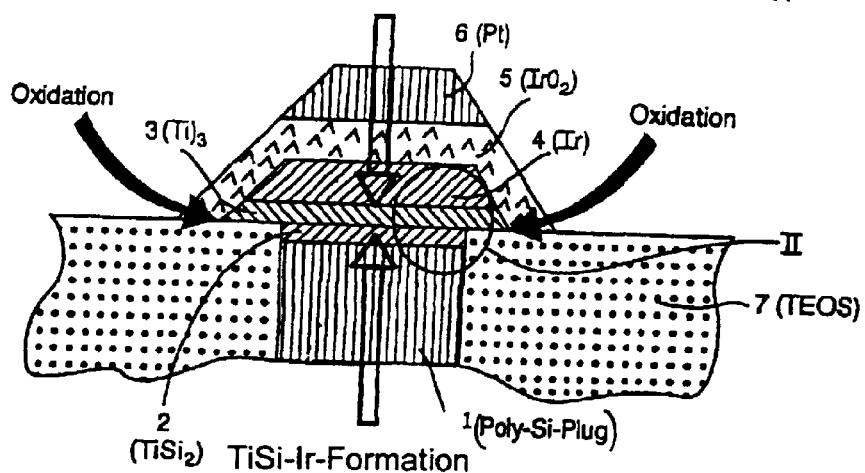
FIG. 1 is a diagrammatic, cross-sectional view through part of a ferroelectric memory constructed in accordance with the stacked cell principle, illustrating the competing processes occurring during an RTP step according to the prior art.
Figure 2A:
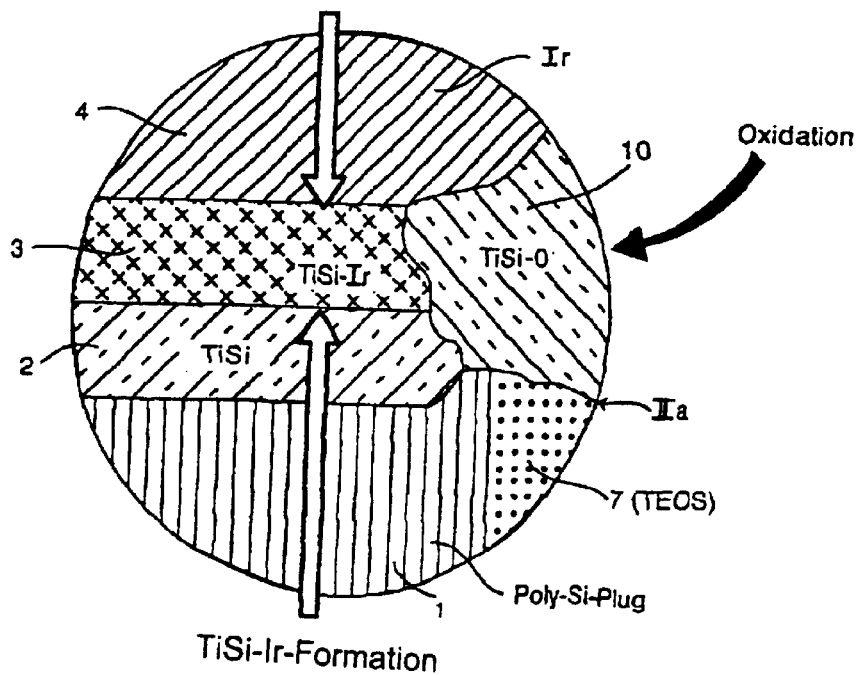
FIGS. 2A and 2B are detailed sectional views of excerpts from FIG. 1, respectively illustrating a process which leads to a functioning electrical connection (FIG. 2A) and a process which leads to the conductive connection being broken as a result of oxidation of the bonding layer (FIG. 2B)
Figure 2B:
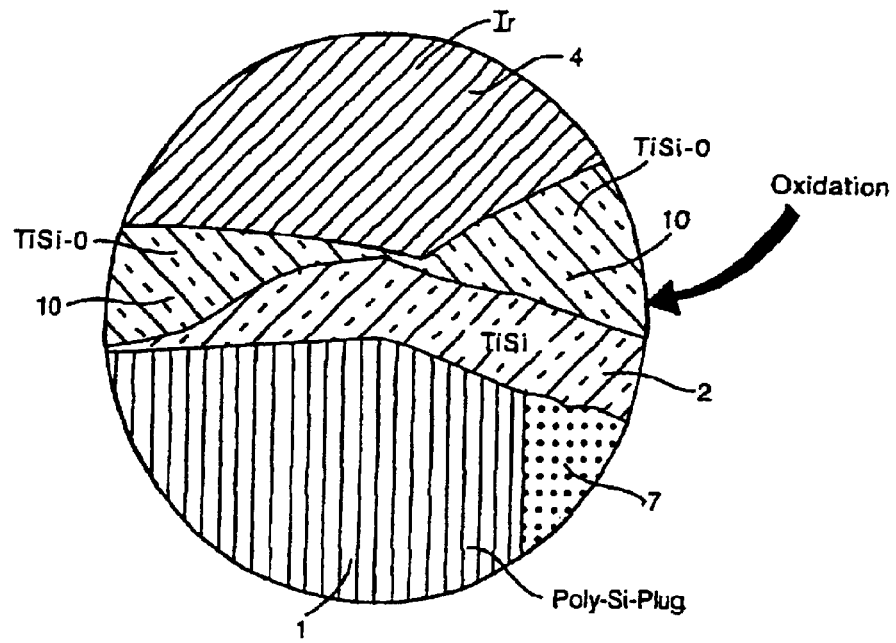
Figure 3:
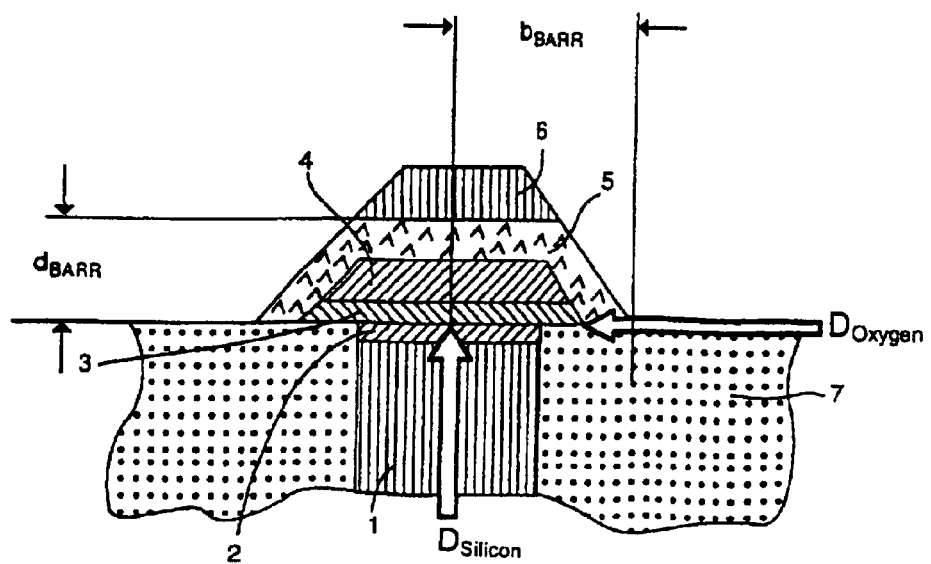
FIG. 3 is a sectional view through a functioning ferroelectric memory cell that is constructed in accordance with the stacked cell principle, similar to that shown in FIG. 1, illustrating the method according to the invention.

Referring now to the figures of the drawing in detail and first, particularly, to FIG. 3 thereof, which like FIG. 1 shows a cross-sectional view through part of a ferroelectric memory cell constructed according to the stacked cell principle, and shows the variables that are of importance to the method according to the invention. The variables are thickness $d_{BARR}$ of the layer system containing the bonding layer 2, 3 and the oxygen diffusion barrier 4, 5, $b_{BARR}$, which is half the width of the layer system, $D_{oxygen}$ (bold arrow), representing the (temperature-dependent) diffusion coefficient of oxygen in the material of the bonding layer 2, 3, and $D_{silicon}$ (bold arrow from below), representing the (temperature-dependent) diffusion coefficient of silicon, which is crucial to the siliciding of the bonding layer 2, 3.

In the relationship $$\frac{(d_{BARR})^2}{D_{silicon}} \left/ \frac{(b_{BARR})^2}{D_{oxygen}} \right., \tag{1}$$

the left-term represents the time required to fully silicide the bonding layer, and the right-hand term represents the time required to fully oxidize the bonding layer.

As has been mentioned, $D_{silicon}$ denotes the temperature-dependent diffusion coefficient of silicon and $D_{oxygen}$ denotes the temperature-dependent diffusion coefficient of oxygen along a defined boundary surface. The quotients d/D or b/D in unit terms result in times. The above relationship indicates the condition required to fabricate a functioning barrier on the basis of the diffusion coefficients determined for a specific species in a specific matrix at a specific temperature and the dimensions indicated in FIG. 3, i.e. the layer thickness $d_{BARR}$ and half the layer width $b_{BARR}$. At a specific temperature, where D is a function of the temperature, and with selected dimensions b and d, the term required for siliciding (left-hand term) has to be shorter than the time required for oxidation (right-hand term).

In the case of a fabrication process carried out by way of example, first a RTP step was carried out (after the top electrode patterning) at 800° C. for 15 seconds in oxygen, followed by the ferro anneal in $O_2$ at a temperature of approximately 675° C. for 15 minutes. TEM images taken for ferroelectric memory cells fabricated using the fabrication method showed that the TiSi—O regions formed from the side was so small that they were unable to break the conductive connection between the polysilicon plug and the lower capacitor electrode via the bonding layer and the oxygen diffusion barrier.

We claim:

1. A method for fabricating ferroelectric memory cells in accordance with the stacked principle, which comprises the steps of:

providing a conductive plug formed of polysilicon;

forming a bonding layer directly above the conductive plug and between a lower capacitor electrode of a ferroelectric storage capacitor and the conductive plug, the conductive plug being formed beneath the ferroelectric storage capacitor and electrically connecting the lower capacitor electrode to a transistor electrode of a selection transistor formed either in or on a semiconductor wafer;

forming an oxygen diffusion barrier above the bonding layer; and performing a rapid thermal process (RTP) step in an oxygen atmosphere, after a ferroelectric deposition and before a ferro anneal has been performed, the RTP step including the steps of:

determining the oxidation rate of the bonding layer and a first diffusion coefficient ($D_{oxygen}$) of oxygen in a material of the bonding layer which depends on temperature;

determining a second diffusion coefficient ($D_{silicon}$) of silicon in the material of the bonding layer which depends on the temperature; and calculating an optimum temperature range for the RTP step from the first and second diffusion coefficients ($D_{oxygen}$ and $D_{silicon}$) for a predetermined layer thickness and a layer width of a layer system formed of the bonding layer and the oxygen diffusion barrier from the relationship $$\frac{(d_{BARR})^2}{D_{silicon}} \langle \frac{(b_{BARR})^2}{D_{oxygen}}$$

in which the left-hand term denotes a period of time required for full siliciding of the bonding layer, and the right-hand term denotes a period of time required to fully oxidize the bonding layer, $d_{BARR}$ denotes the predetermined layer thickness of the layer system formed of the bonding layer and the oxygen diffusion barrier, $b_{BARR}$ denotes half the layer width of the layer system containing the bonding layer and the oxygen diffusion barrier, so that during the RTP step siliciding of the bonding layer takes place more quickly than its oxidation.

2. The method according to claim 1, wherein after the RTP step the bonding layer contains a lower layer made from $TiSi_2$ and an upper layer made from Ti and disposed directly above the lower layer.

3. The method according to claim 2, which further comprises forming the oxygen diffusion barrier, prior to the RTP step, to contain a diffusion lower layer made of Ir lying directly above the upper layer of the bonding layer, and a diffusion upper layer of $IrO_2$ directly covering the diffusion lower layer of the oxygen diffusion barrier.

* * * * *